(12) United States Patent
BrightSky et al.

(10) Patent No.: US 9,059,404 B2
(45) Date of Patent: Jun. 16, 2015

(54) RESISTIVE MEMORY WITH A STABILIZER

(71) Applicant: International Business Machines Corporation, Armonk, NY (US)

(72) Inventors: Matthew J. BrightSky, Pound Ridge, NY (US); SangBum Kim, Yorktown Heights, NY (US); Chung H. Lam, Peekskill, NY (US); Asit K. Ray, Baldwin Place, NY (US); Norma E. Sosa Cortes, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 13/969,220

(22) Filed: Aug. 16, 2013

(65) Prior Publication Data

US 2014/0377929 A1    Dec. 25, 2014

Related U.S. Application Data

(63) Continuation of application No. 13/924,734, filed on Jun. 24, 2013, now Pat. No. 9,006,700.

(51) Int. Cl.
*H01L 21/00* (2006.01)
*H01L 45/00* (2006.01)

(52) U.S. Cl.
CPC ............ *H01L 45/1683* (2013.01); *H01L 45/12* (2013.01); *H01L 45/06* (2013.01); *H01L 45/1226* (2013.01); *H01L 45/1233* (2013.01); *H01L 45/144* (2013.01)

(58) Field of Classification Search
CPC ..... H01L 45/06; H01L 45/12; H01L 45/1226; H01L 45/1233; H01L 45/144; H01L 45/1683
USPC .................................................. 438/382–384
See application file for complete search history.

(56) References Cited

U.S. PATENT DOCUMENTS

2006/0060832 A1*    3/2006    Symanczyk et al. .............. 257/3

* cited by examiner

*Primary Examiner* — Richard Booth
(74) *Attorney, Agent, or Firm* — Ido Tuchman; Louis J. Percello

(57) ABSTRACT

A resistive memory device and a method for fabricating the resistive memory device. The memory device includes a first electrode and a resistive memory element in electrical contact. The memory device also includes a non-programmable stabilizer element in electrical and thermal contact with the resistive memory element. The stabilizer element has at least one physical dimension based on a physical characteristic of the resistive memory element such that the maximum resistance of the stabilizer element is substantially less than the maximum resistance of the resistive memory element.

8 Claims, 12 Drawing Sheets

$$R_M = \sum_{i=1}^{n} R_{mi} // R_{si} = \sum_{i=1}^{n} \frac{R_{mi} \cdot R_{si}}{R_{mi} + R_{si}}$$

$$= \sum_{i=1}^{n} \frac{\rho_{mi} \cdot \rho_{si}}{A_{si} \cdot \rho_{mi} + A_{mi} \cdot \rho_{si}} \Delta z_i$$

$$= \int_{0}^{z_0} \frac{\rho_m(z) \cdot \rho_s(z)}{A_s(z) \cdot \rho_m(z) + A_m(z) \cdot \rho_s(z)} \cdot dz$$

$$R_M = \sum_{i=1}^{p} \int_{z_s(i)}^{z_f(i)} (R_{m1}(z) // R_s(z)) \cdot dz$$
$$+ \sum_{j=1}^{q} \int_{z_s(j)}^{z_f(j)} (R_{m2}(z) // R_s(z)) \cdot dz$$

FIG. 10A $$R_M = \sum_{i=1}^{p} \int_{z_s(i)}^{z_f(i)} \frac{\rho_{m1}(z) \cdot \rho_s(z)}{A_s(z) \cdot \rho_{m1}(z) + A_{m1}(z) \cdot \rho_s(z)} \cdot dz$$
$$+ \sum_{j=1}^{q} \int_{z_s(j)}^{z_f(j)} \frac{\rho_s(z)}{A_s(z)} \cdot dz$$

FIG. 10B

| Material | ρ(ohm·m) | k (W/K·m) |
|---|---|---|
| cGST | 3.0e-5 | 3.0 |
| aGST | 1.0e-2 | NA |
| Stabilizer | 1e-3 | 6 |
| TiN | 2e-6 | 12 |
| $Si_3N_4$ | NA | 0.3 |
| $SiO_2$ | NA | 1.4 |

RESISTIVE MEMORY WITH A STABILIZER

CROSS-REFERENCE TO RELATED APPLICATIONS

This application claims priority under 35 U.S.C. §120 to U.S. patent application Ser. No. 13/924,734 filed Jun. 24, 2013, the entire text of which is specifically incorporated by reference herein.

BACKGROUND

This invention relates to computer memory, and more particularly to a resistive memory device design and method for fabricating a resistive memory device.

Resistive memory is a growing technology due to problems associated with scaling charge-based memory devices. However, the resistance of the resistive memory cell is not necessarily stable. Instability in resistance causes issues such as read errors, especially for multi-level cell operations. For example, phase change material in the phase change memory can be programmed to a crystalline or amorphous phase. The phase change material shows a large resistivity contrast between two phases, which create a room for multi level cell. However, the resistivity of the phase change material in the amorphous phase shows instability due to dependence on instability factors such as temperature change and temporal drift. Instability of the materials' resistivity greatly affects the operations of memory cells.

BRIEF SUMMARY

Accordingly, one example aspect of the present invention is a memory device. The memory device includes a first electrode and a resistive memory element positioned above the first electrode. The resistive memory element is in electrical contact with the first electrode. The memory device also includes a non-programmable stabilizer element in electrical and thermal contact with the resistive memory element. At least one physical dimension of the stabilizer element is based on a physical characteristic of the resistive memory element such that the maximum resistance of the stabilizer element is less than the maximum resistance of the resistive memory element.

Another example of the present invention is a method for fabricating a memory device. The method includes forming a first electrode. A non-programmable stabilizer element is formed proximate the first electrode such that the stabilizer element is in electrical contact with the first electrode. The method also includes forming a resistive memory element proximate the first electrode such that the resistive memory element is in electrical and thermal contact with the stabilizer element. At least one physical dimension of the stabilizer element is based on a physical characteristic of the resistive memory element such that the maximum resistance of the stabilizer element is less than the maximum resistance of the resistive memory element.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 9A is a simplified circuit diagram depicting a memory device according to one embodiment of the present invention.

FIGS. 9B through 10B are formulas representing the resistance of a memory device according to one embodiment of the present invention.

FIG. 11 is a table depicting the material property results of a simulation phase change memory device according to one embodiment of the present invention.

DETAILED DESCRIPTION

Figure 1A:
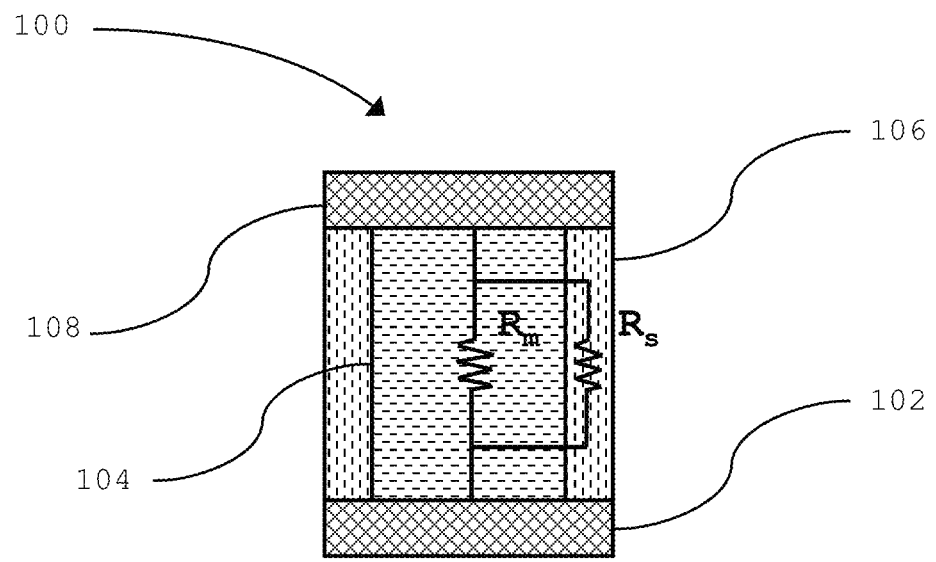
FIG. 1A depicts a memory device according to one embodiment of the present invention.

The present invention is described with reference to embodiments of the invention. Throughout the description of the invention reference is made to FIGS. 1A-11. When referring to the figures, like structures and elements shown throughout are indicated with like reference numerals.

FIG. 1A depicts a memory device 100 according to one embodiment of the present invention. The memory device 100 includes a first electrode 102. The memory device also includes a resistive memory element 104 having a resistance $R_m$, and a non-programmable stabilizer element 106 having a resistance $R_s$. The resistive memory element 104 is in electrical contact with the first electrode 102. Additionally, the resistive memory element 104 and the stabilizer element 106 are in thermal and electrical contact with one another. In this embodiment, a second electrode 108 is positioned above the resistive memory element 104 and the stabilizer element 106 such that the second electrode 108 is in electrical contact with both the resistive memory element 104 and the stabilizer element 106. In this embodiment, the stabilizer element 106 laterally surrounds the resistive memory element 104.

The non-programmable stabilizer element 106 may be comprised of a metal or polysilicon material. Such materials may include, but are not limited to, tantalum nitride, titanium nitride, titanium aluminum nitride, and titanium silicon nitride. In some embodiments, the thickness of the stabilizer element 106 is between 4 and 5 nanometers.

Figure 1B:
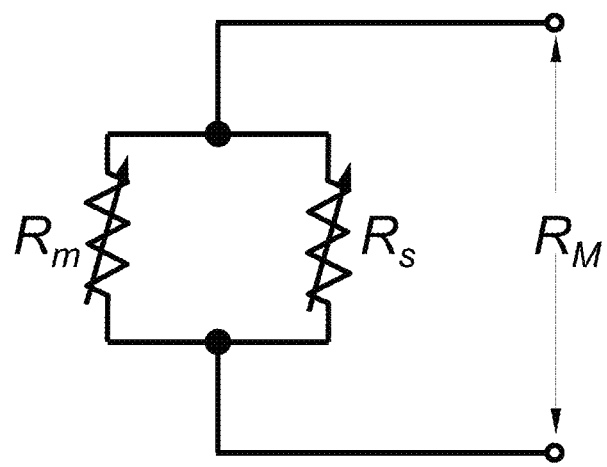
FIG. 1B is a simplified circuit diagram depicting a memory device according to one embodiment of the present invention.

FIG. 1B is a simplified circuit diagram depicting a memory device 100 according to one embodiment of the present invention. The memory device 100 has a resistance of $R_M$ based on the resistance of the resistive memory element 104 ($R_m$) and the stabilizer element 106 ($R_s$) in parallel configuration. The resistive memory element 104 and stabilizer element 106 are configured such that the maximum resistance of the stabilizer element 106 ($R_s$,max) is less than the maximum resistance of the resistive memory element 104 ($R_m$,max). In one embodiment, the maximum resistance of the stabilizer element 106 is at least ten times less than the maximum resistance of the resistive memory element 104. $R_s$ may be configured based on a function of a physical characteristic state of the resistive memory element 104. As used herein, a "physical characteristic state" of the resistive memory is transient (i.e., includes a programmable state of the resistive memory element such as fully amorphous, partially amorphous, and fully crystalline). The stabilizer element 106 is configured to have the opposite dependence of one or more physical characteristics responsible for the instability of the resistive memory element's 104 resistance. In some embodiments, there are a plurality of stabilizer elements 106 configured in parallel to further decrease the instability of the memory device 100 based on a plurality of physical characteristics.

Figure 2A:
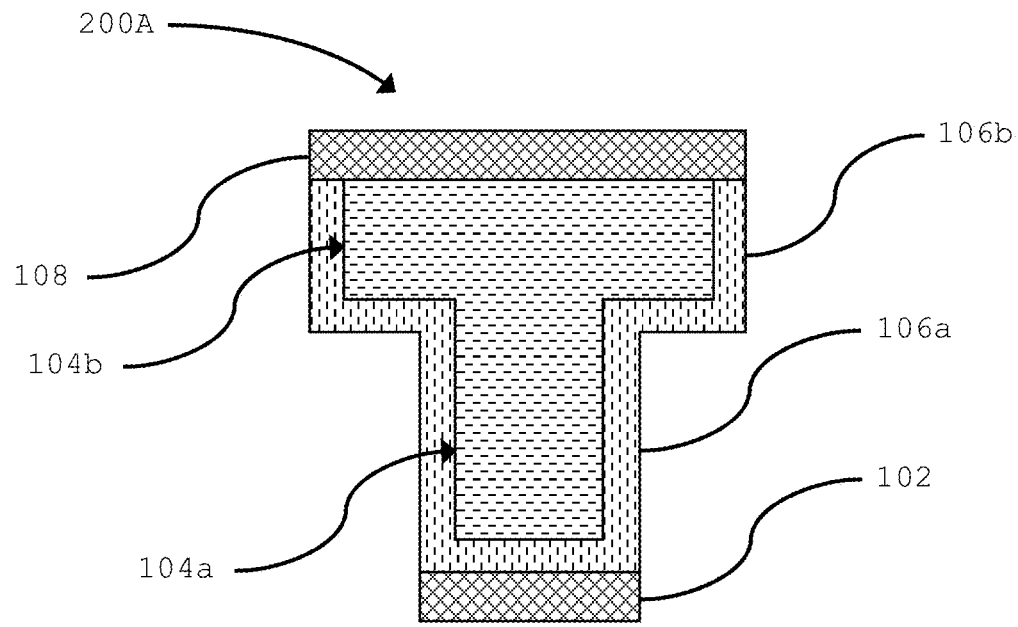
FIG. 2A depicts a memory device according to one embodiment of the present invention.

FIG. 2A depicts a memory device 200A according to one embodiment of the present invention. In this embodiment, a portion of the stabilizer element 106 is positioned between the first electrode 102 and the resistive memory element 104. The lateral dimensions of the first electrode 102 are less than the lateral dimensions of the second electrode 108. The resistive memory element 104 and the stabilizer element 106 each include a bottom portion 104a/106a and a top portion 104b/106b. In this embodiment, the lateral dimensions of the bottom portions 104a/106a are substantially less than the lateral dimensions of the top portions 104b/106b.

Figure 2B:
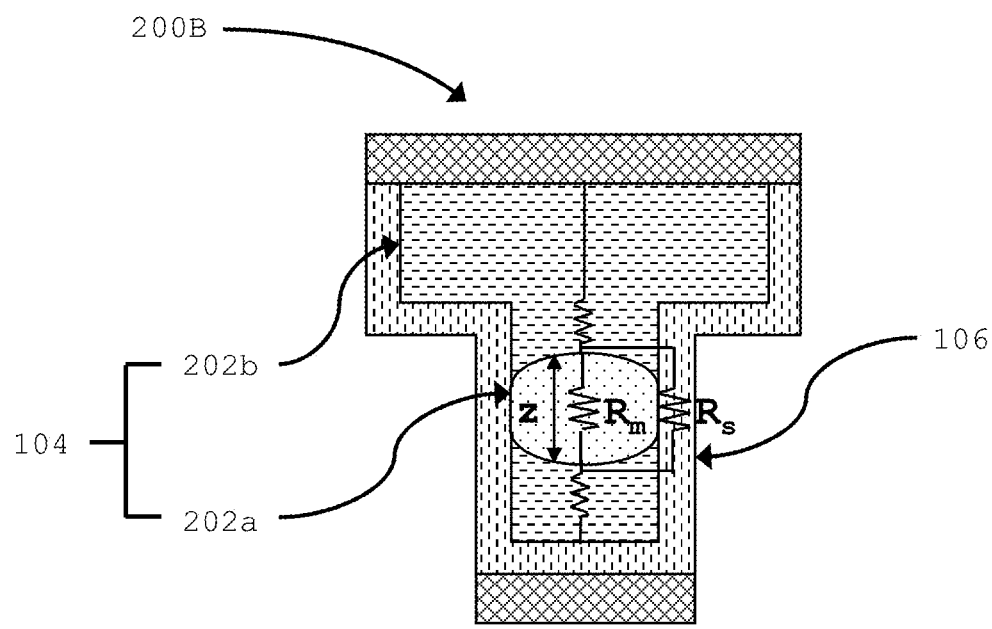
FIG. 2B depicts a phase change memory cell according to one embodiment of the present invention.

FIG. 2B depicts a memory device 200B according to one embodiment of the present invention. In this embodiment, the resistive memory element 104 includes a region in high resistance state 202a and a rest region in low resistance state 202b. The resistance of the rest region 202b is substantially different from the resistance of the region in high resistance state 202a. Additionally, the region in high resistance state 202a has a physical dimension z. A portion of the rest region 202b is positioned closer to the second electrode 108 than the region in high resistance state 202a. The lateral dimensions of the rest region 202b are substantially larger than the lateral dimensions of the region in high resistance state 202a. In one embodiment, the lateral dimensions of the rest region 202b are at least two times larger than the lateral dimensions of the region in high resistance state 202a.

Figure 3A:
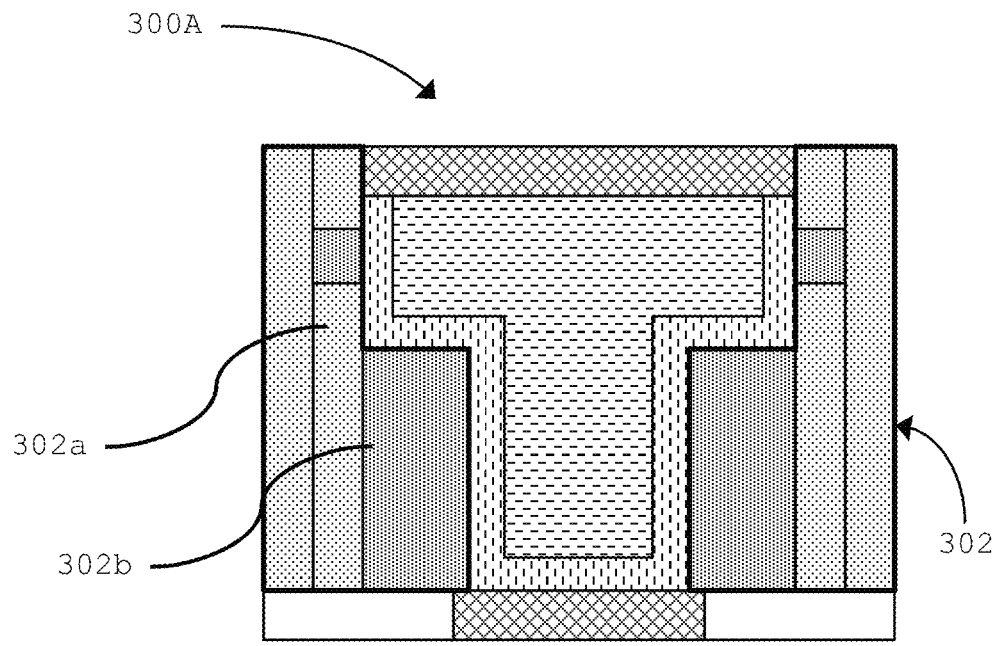
FIG. 3A depicts a memory device according to one embodiment of the present invention.
Figure 3B:
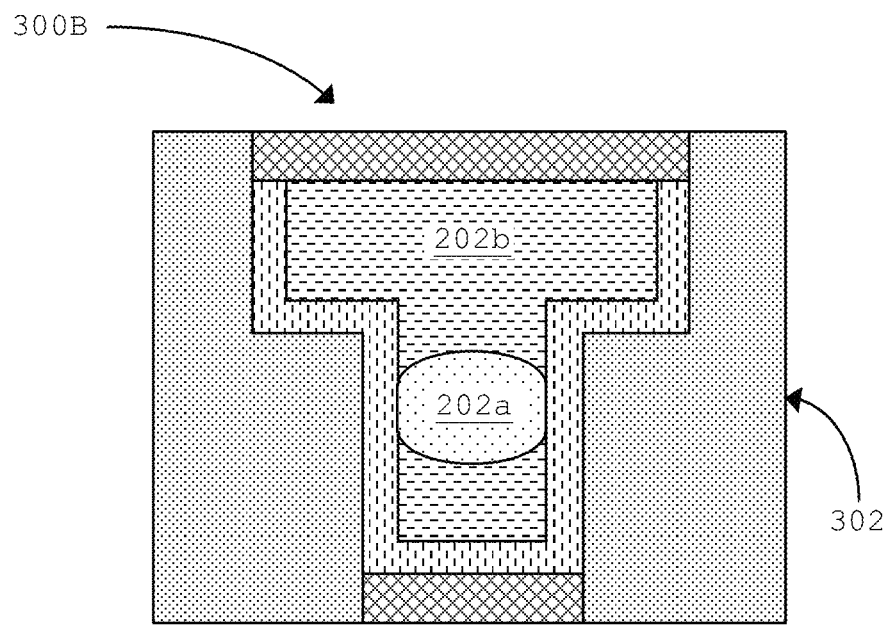
FIG. 3B depicts a phase change memory cell according to one embodiment of the present invention.

FIG. 3A depicts a memory device 300A according to one embodiment of the present invention. The memory device 300A includes an insulating region 302 laterally surrounding at least a portion of the stabilizer element 106. In this embodiment, the insulating region 302 includes a first dielectric layer 302a, and a mold layer 302b. The first dielectric layer 302a and the mold layer 302b are comprised of a plurality of dielectric layers consisting of either silicon-oxide or silicon-nitride. FIG. 3B depicts a memory device 300B according to one embodiment of the present invention. This embodiment includes a region in high resistance state 202a, a rest region 202b, and an insulating region 302.

Figure 4A:
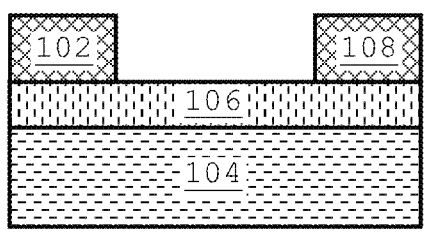
FIGS. 4A-4D depict a variety of memory devices according to embodiments of the present invention.
Figure 4B:
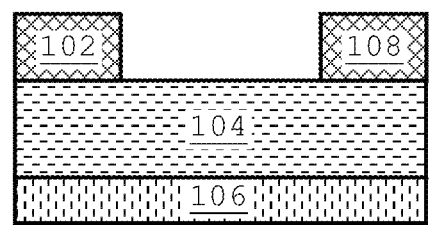

FIGS. 4A-4D depict embodiments wherein the first electrode 102 and second electrode 108 are positioned above the resistive memory element 104 and stabilizer element 106. In FIG. 4A, the stabilizer element 106 is positioned above the resistive memory element 104. In FIG. 4B, the resistive memory element 104 is positioned above the stabilizer element 106.

Figure 4C:
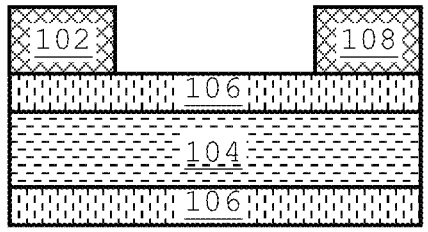
Figure 4D:
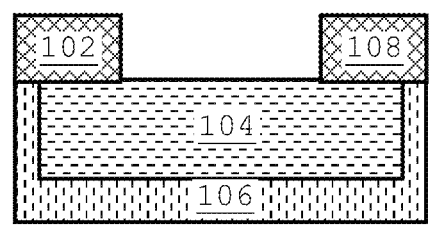

FIG. 4C depicts a configuration in which the stabilizer element 106 surrounds the resistive memory element 104 on at least the top and bottom. FIG. 4D depicts a configuration wherein the stabilizer element 106 forms a path between the first electrode 102 and the second electrode 108, below the resistive memory element 104.

Figure 5:
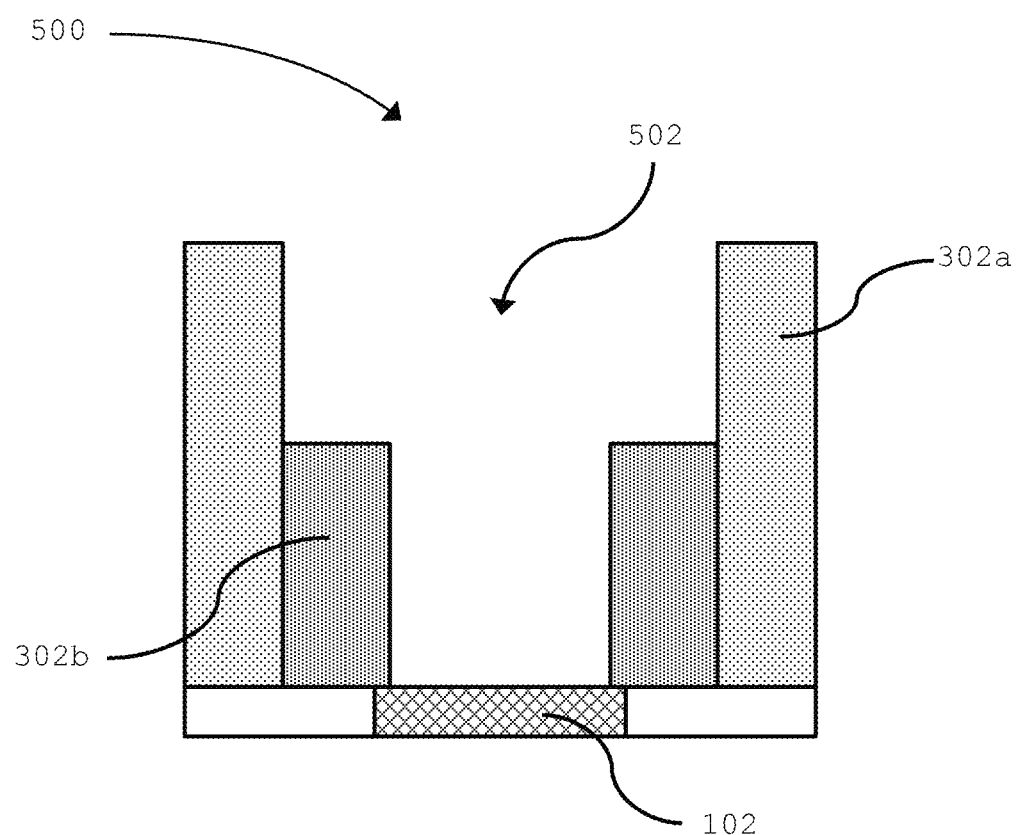
FIG. 5 depicts an intermediary step during fabrication of a memory device according to one embodiment of the present invention.

FIG. 5 depicts an intermediary step during fabrication of a memory device according to one embodiment of the present invention. This figure depicts a memory device 500 after etching a via 502 through the mold layer 302b to expose the first electrode 102.

Figure 6:
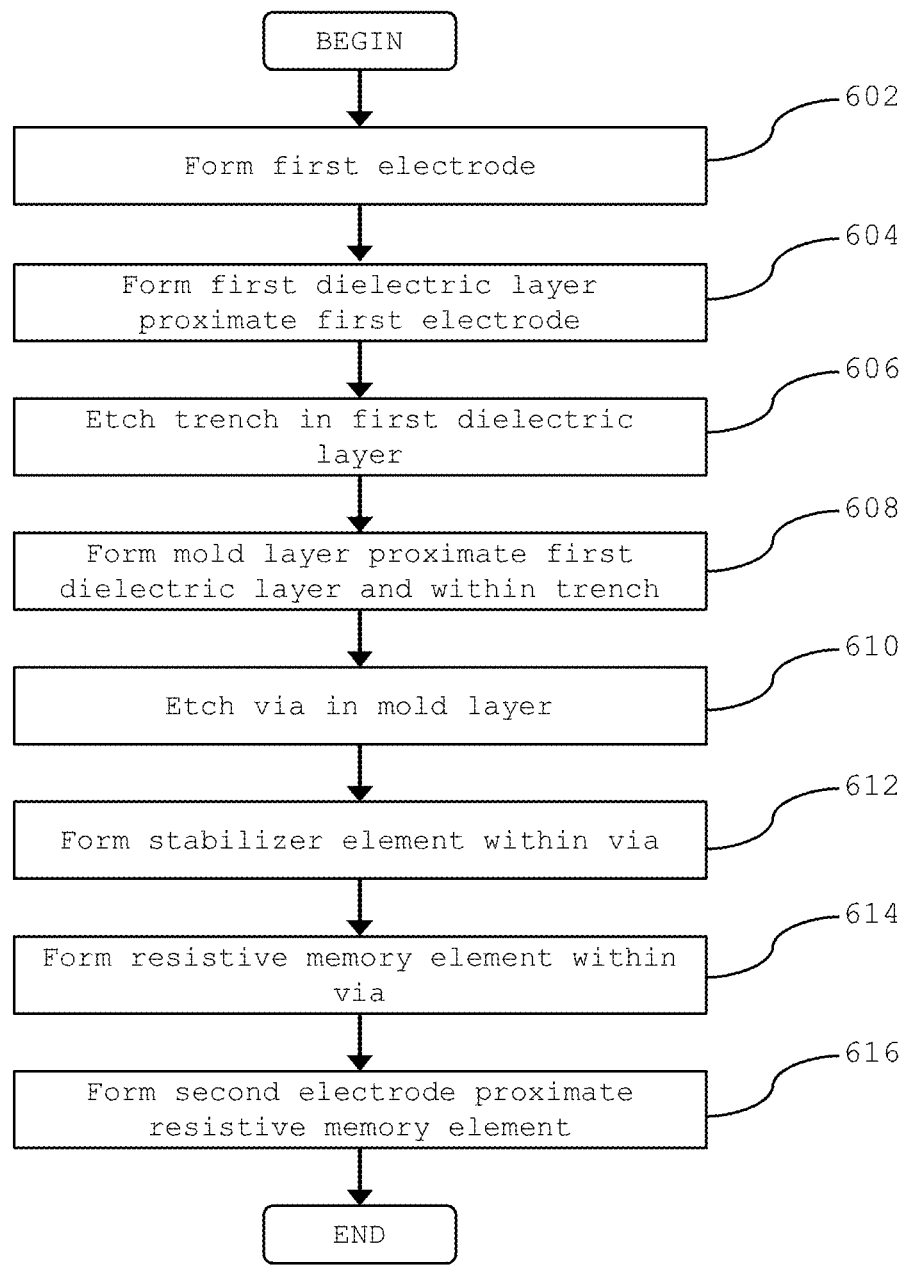
FIG. 6 is a flowchart depicting a method for fabricating a memory device according to one embodiment of the present invention.

FIG. 6 is a flowchart illustrating a method for fabricating a memory device according to one embodiment of the present invention. The method begins with forming step 602. At forming step 602, the first electrode 102 is formed within a substrate. One skilled in the art would recognize that any number of conductive materials may be utilized for the first electrode 102. After forming step 602, the method proceeds to forming step 604.

At forming step 604, the first dielectric layer 302a is formed proximate the first electrode 102. After forming step 604, the method proceeds to etching step 606. At etching step 606, a trench is etched into the first dielectric layer 302a, directly above the first electrode 102. After etching step 606, the method proceeds to forming step 608.

At forming step 608, the mold layer 302b is formed proximate the first dielectric layer 302a. The mold layer 302b may be conformally deposited over the first dielectric layer 302a and within the trench. After forming step 608, the method proceeds to etching step 610.

At etching step 610, a portion of the mold layer 302b is etched to form the via 502. The via 502 exposing a portion of the first electrode 102. In such an embodiment, the lateral dimensions of the via 502 near the first electrode 102 are smaller than the lateral dimensions where the second electrode 108 is to be formed. After etching step 610, the method proceeds to 612.

At forming step 612, the non-programmable stabilizer element 106 is formed within the via 502. In some embodiments, forming the stabilizer element 106 includes conformally depositing the stabilizer element 106 over the insulating region 302 and along the sidewalls of the via 502, then removing the portion of the stabilizer element 106 above the via 502. The stabilizer element 106 is in electrical contact with the first electrode 102. After forming step 612, the method proceeds to forming step 614.

At forming step 614, the resistive memory element 104 is formed within the via 502. The resistive memory element 104 is in electrical and thermal contact with the stabilizer element 106. After forming step 614, the method proceeds to forming step 616.

At forming step 616, a second electrode 108 is formed proximate the resistive memory element 104 and stabilizer element 106. The second electrode 108 is in electrical contact with both the resistive memory element 104 and stabilizer element 106. After forming step 616, the method is complete.

Figure 7A:
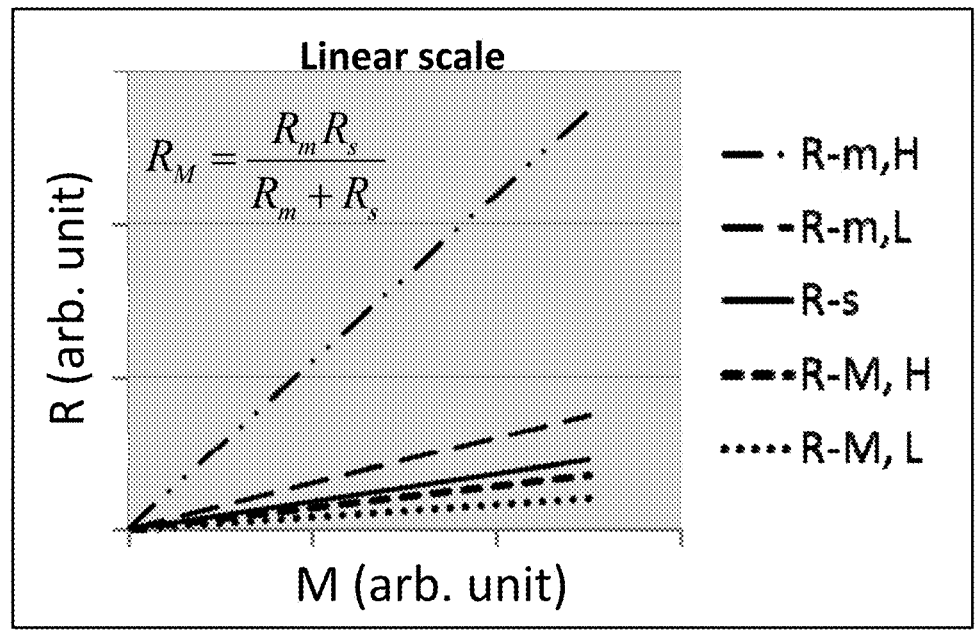
FIG. 7A is a graph depicting variability in resistance versus a given physical characteristic on a linear scale, according to one embodiment of the present invention.
Figure 7B:
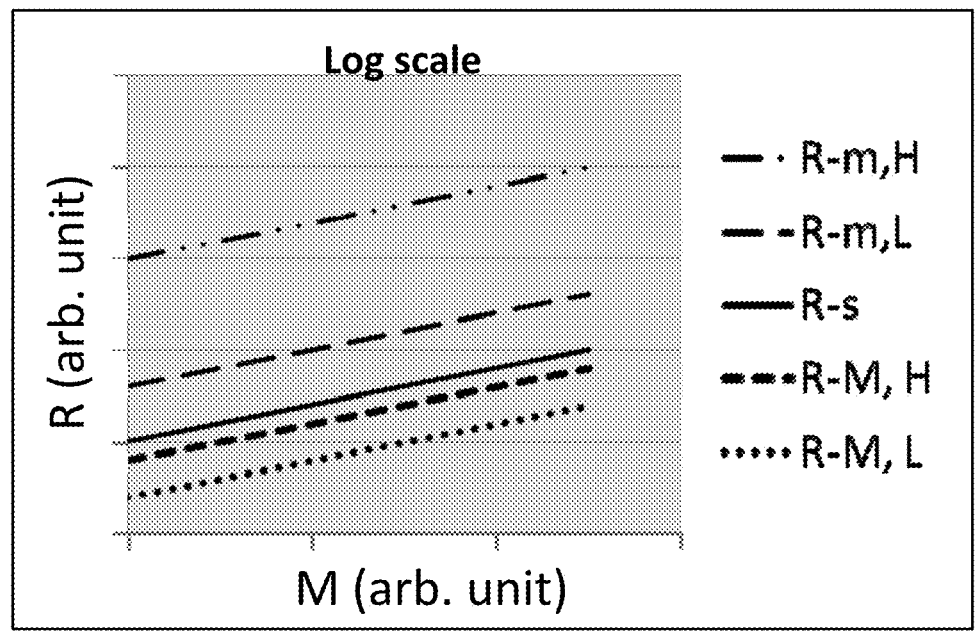
FIG. 7B is a graph depicting variability in resistance versus a given physical characteristic on a logarithmic scale, according to one embodiment of the present invention.

FIG. 7A is a graph depicting variability in resistance versus a given physical characteristic on a linear scale, according to one embodiment of the present invention. FIG. 7B is a graph depicting the same embodiment as FIG. 7A, but on a logarithmic scale. The resistance of resistive memory element 104 varies between R-m,H and R-m,L. The stabilizer element 106 has a resistance R-s. The overall resistance of the memory device 100 varies between R-M,H and R-M,L.

In this embodiment, the resistance of the stabilizer element 106 is relatively independent to the given instability factor, with regard to the resistive memory element 104. However, in some embodiments, the relationship between R-s and a certain instability factor may be opposite in polarity to the relationship between R-m and the same instability factor. For example, given a memory device in which R-m decreases as temperature increases: then the stabilizer element 106 would have a temperature characteristic in which R-s increases as temperature increases. Other examples of instability factor would be temporal characteristics and noise.

Figure 8A:
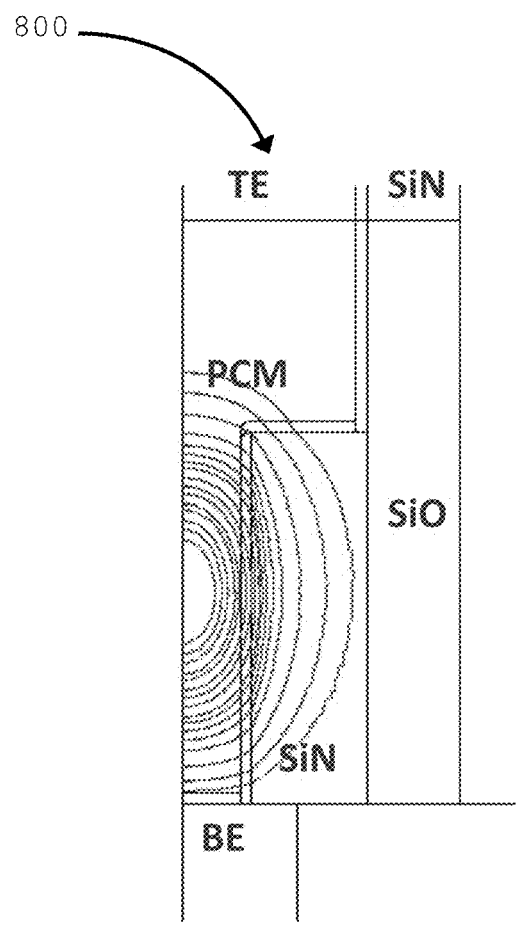
FIG. 8A depicts a memory device according to one embodiment of the present invention.
Figure 8B:
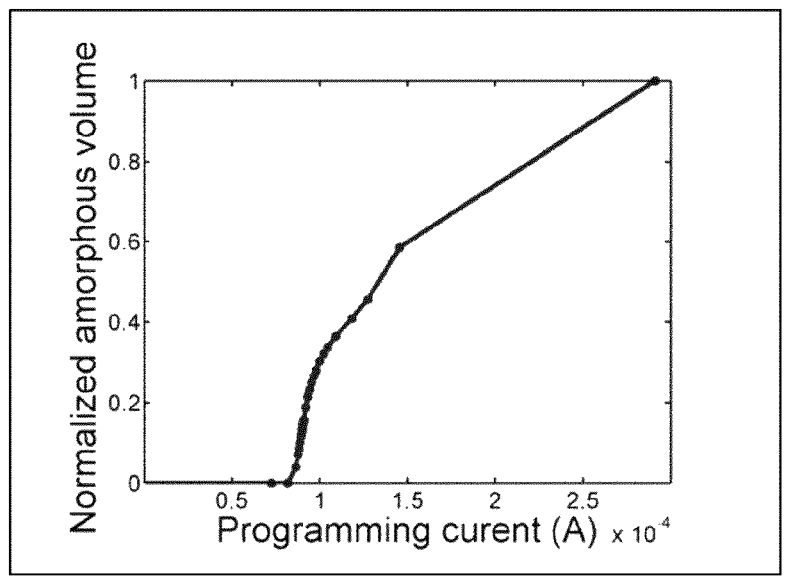
FIG. 8B is a graph depicting amorphous volume as a function of current in memory device according to one embodiment of the present invention.
Figure 8C:
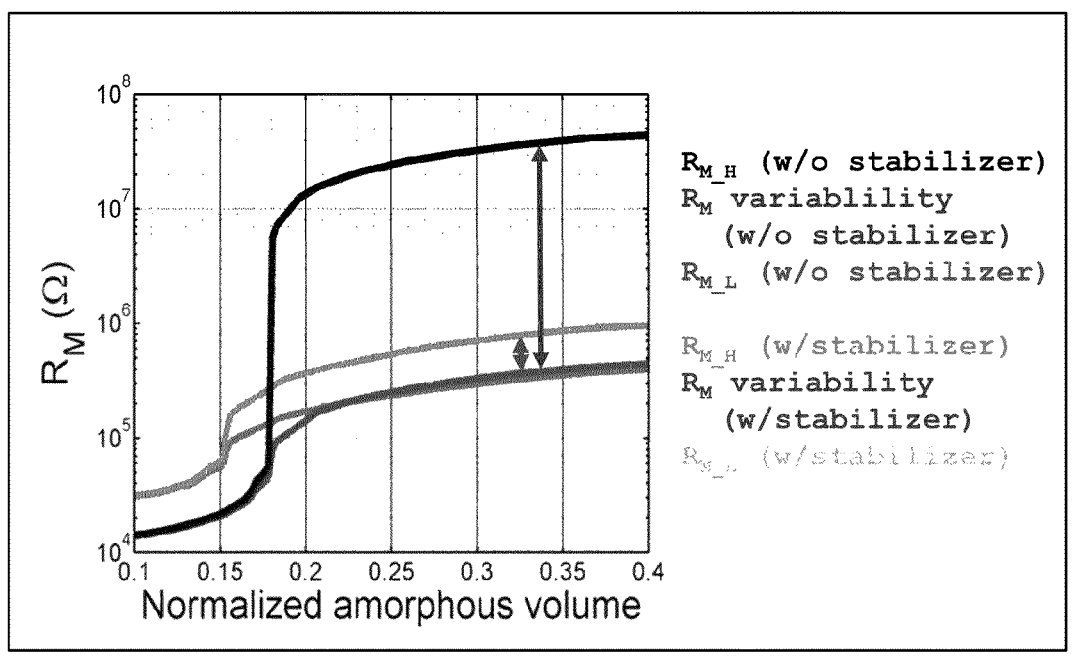
FIG. 8C is a graph depicting resistance as a function of volume in memory device according to one embodiment of the present invention.

FIG. 8A depicts a memory device 800 according to one embodiment of the present invention. In this embodiment, the given physical characteristic state is amorphous volume. The concentric circles depict the amorphous region of the phase change memory cell. FIG. 8B is a graph depicting amorphous volume as a function of current in memory device 800. As programming current is applied to the resistive memory element 104, the phase change memory amorphous region 202a increases in volume. FIG. 8C is a graph depicting resistance as a function of amorphous volume in memory device 800. FIG. 8C displays the variability of R-M with and without the stabilizer element 106.

Figures 9A, 9B, 9C:
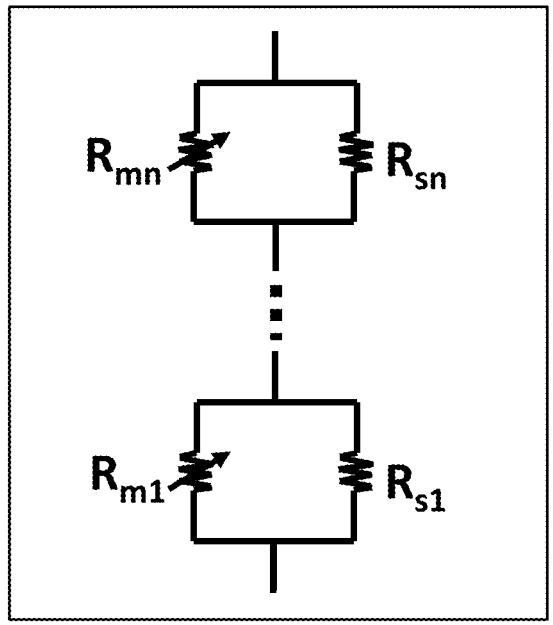

FIG. 9A is a simplified circuit diagram depicting a memory device according to one embodiment of the present invention. The overall resistance of the memory device $R_M$ is based on effective cross-sectional area (A), a given physical dimension (z), and resistivity ($\rho$) of the resistive memory element 104 and stabilizer element 106. This can be represented in the formula given in FIG. 9B. As n approaches infinity, $R_M$ can be represented as the formula given in FIG. 9C.

FIG. 10A is a formula representing $R_M$ of a resistive memory element 104 programmable to a low resistance state, $R_{m1}(z)$, or a high resistance state, $R_{m2}(z)$. When the maximum resistance of the stabilizer element 106 is substantially less than the maximum resistance of the resistive memory element 104, the formula in FIG. 10A can be approximated as the formula in FIG. 10B. $R_M$ is not dependent on the resistivity of the resistive memory element 104 in the high resistance state, $\rho_{m2}(z)$. Therefore, $R_M$ is not affected by the instability of $\rho_{m2}(z)$.

FIG. 11 is a table depicting the material property results of a simulation phase change memory device according to one embodiment of the present invention. In this embodiment the memory device is a 20 nanometer phase change memory cell with a key hole configuration. The region in high resistance state 202a is amorphous (aGST) in the high resistance state. The region in high resistance state 202a in the low resistance state and the rest region 202b are crystalline GST (cGST). The resistivity and thermal characteristics of the relevant materials are listed in the table.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a memory device comprising:
   forming a first electrode within a substrate;
   forming an insulating region defining a via, the via having a T-shaped cross-sectional area;
   forming a non-programmable stabilizer element proximate the first electrode, the stabilizer element lining the via and is in electrical contact with the first electrode;
   forming a resistive memory element positioned within the via and proximate the first electrode, wherein the resistive memory element is in physical contact with the first electrode and the stabilizer element, the resistive memory element having the T-shaped cross-sectional area and is programmable to a crystalline phase and an amorphous phase; and
   wherein at least one physical dimension of the stabilizer element is based on an amorphous volume of the resistive memory element in the amorphous phase such that the maximum resistance of the stabilizer element is less than the maximum resistance of the resistive memory element.

2. The method of claim 1, further comprising:
   forming an insulating region over the first electrode and substrate, the insulating layer including a via directly above the first electrode.

3. The method of claim 2, wherein forming the insulating region includes:
   forming a first dielectric layer over the first electrode and substrate;
   etching a trench within the first dielectric layer directly over the first electrode such that a portion of the first electrode is exposed;
   forming a mold layer over the first dielectric layer, such that a portion of the mold layer is within the trench; and
   etching a portion of the mold layer such that a portion of the first electrode is exposed.

4. The method of claim 2, further comprising:
   wherein forming the stabilizer element includes conformally depositing the stabilizer element within the via;
   wherein forming the resistive memory element includes depositing the resistive memory element within the via; and
   forming a second electrode proximate the resistive memory element, the second electrode being in electrical contact with the resistive memory element.

5. The method of claim 1, wherein the resistance of the stabilizer element is substantially less dependent on at least one physical characteristic than the resistance of the resistive memory element.

6. The method of claim 1, wherein a correlation between resistance and at least one physical characteristic of the stabilizer element has a negative polarity to that of a correlation between resistance and the at least one physical characteristic of the resistive memory element.

7. The method of claim 1, wherein the stabilizer element includes one of a metal and polysilicon material.

8. The method of claim 1, wherein the stabilizer element includes one of a tantalum nitride, titanium nitride material, titanium aluminum nitride, and titanium silicon nitride.

* * * * *